(12) United States Patent
Gupta et al.

(10) Patent No.: US 11,574,660 B2
(45) Date of Patent: Feb. 7, 2023

(54) CIRCUITS AND METHODS FOR CAPACITOR MODULATION

(71) Applicant: Arm Limited, Cambridge (GB)

(72) Inventors: Lalit Gupta, Cupertino, CA (US); Nimish Sharma, Jalandhar (IN); Hetansh Pareshbhai Shah, Ahmedabad (IN); Bo Zheng, Cupertino, CA (US)

(73) Assignee: Arm Limited, Cambridge (GB)

( * ) Notice: Subject to any disclaimer, the term of this patent is extended or adjusted under 35 U.S.C. 154(b) by 38 days.

(21) Appl. No.: 16/989,883

(22) Filed: Aug. 11, 2020

(65) Prior Publication Data

US 2022/0051704 A1    Feb. 17, 2022

(51) Int. Cl.
| G11C 7/10 | (2006.01) |
| G11C 7/06 | (2006.01) |
| G11C 16/26 | (2006.01) |
| G11C 16/10 | (2006.01) |

(52) U.S. Cl.
CPC ............ *G11C 7/1012* (2013.01); *G11C 7/062* (2013.01); *G11C 7/1039* (2013.01); *G11C 16/10* (2013.01); *G11C 16/26* (2013.01)

(58) Field of Classification Search
CPC ...................................................... G11C 16/26
See application file for complete search history.

(56) References Cited

U.S. PATENT DOCUMENTS

| 7,009,880 | B1 * | 3/2006 | Liu | ......... | G11C 16/26 |
| | | | | | 365/185.11 |
| 8,274,842 | B1 * | 9/2012 | Hollmer | ............. | G11C 13/0011 |
| | | | | | 365/189.04 |
| 9,570,157 | B1 * | 2/2017 | Schuppe | ................. | G11C 7/14 |
| 9,953,726 | B1 * | 4/2018 | Irby | ................... | G11C 13/0069 |
| 2001/0033514 | A1 * | 10/2001 | Takata | ................... | G11C 16/28 |
| | | | | | 365/189.07 |
| 2004/0062116 | A1 * | 4/2004 | Takano | ................. | G11C 16/28 |
| | | | | | 365/207 |
| 2012/0236669 | A1 * | 9/2012 | Yamagami | ......... | G11C 11/4074 |
| | | | | | 365/207 |
| 2019/0385685 | A1 * | 12/2019 | Qiang | ................... | G11C 16/28 |

* cited by examiner

*Primary Examiner* — Douglas King
(74) *Attorney, Agent, or Firm* — Pramudji Law Group PLLC; Ari Pramudji

(57) ABSTRACT

In a particular implementation, a circuit comprises: a memory array including a plurality of bit cells, where each of the bit cells are coupled to a respective bit path; a first multiplexer comprising a plurality of column address locations, where each of the plurality of column address locations is coupled to the memory array and corresponds to a respective bit path capacitance; and a variable capacitance circuit coupled to a reference path and configured to substantially match reference path capacitance to each of the respective bit path capacitances.

11 Claims, 4 Drawing Sheets

US 11,574,660 B2

CIRCUITS AND METHODS FOR CAPACITOR MODULATION

I. FIELD

The present disclosure is generally related to capacitor balancing/modulation circuitry, systems, and methods.

II. DESCRIPTION OF RELATED ART

The growing market of internet of things (IoT) require energy efficient circuits. These devices, in order to interact with their environment, use an embedded nonvolatile memory (NVM) for data storage and code execution. Magnetic random-access memory (MRAM) is one NVM solution adopted due to its low power consumption and high speed.

Unlike conventional random-access memory (RAM) chip technologies, in MRAM, data is not stored as electric charge but is instead stored by magnetic polarization of storage elements. The storage elements are formed from two ferromagnetic layers separated by a tunneling layer. One of the two ferromagnetic layers that is referred to as the fixed layer or pinned layer has a magnetization that is fixed in a particular direction. The other ferromagnetic magnetic layer that is referred to as the free layer has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To read data in a conventional MRAM, a read-current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bit-cell of the MRAM. The two different resistances represent a logic "0" and a logic "1" value stored by the MTJ. The two distinct resistances of the MTJ in a bit-cell of the MRAM are illustrated as low-resistive state (LRS) and high-resistive state (HRS) distributions when comparing the log number of read operation samples and the resistance (kΩ) on a two-dimensional Cartesian graph. Moreover, the logic "1" or logic "0" would represent whether an example bit cell to be read is higher or lower with respect to an example reference cell.

In current MRAM circuitry, a read operation may be performed by detecting the voltage drop developed between the reference and bit cells. For example, the reference cell may be held at LRS (low resistive state) while the bit cell may be either LRS or HRS (high resistive state). To accurately perform read operations and correctly ascertain the resistive state, a reference path capacitance of the reference cell should approximately "match" to a bit path resistance of the bit cell (to be read). However, in the current state of the art, capacitive mismatches continue to cause significant signal degradation across various multiplexer locations that prevent capacitor balancing between a reference path and a bit path.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
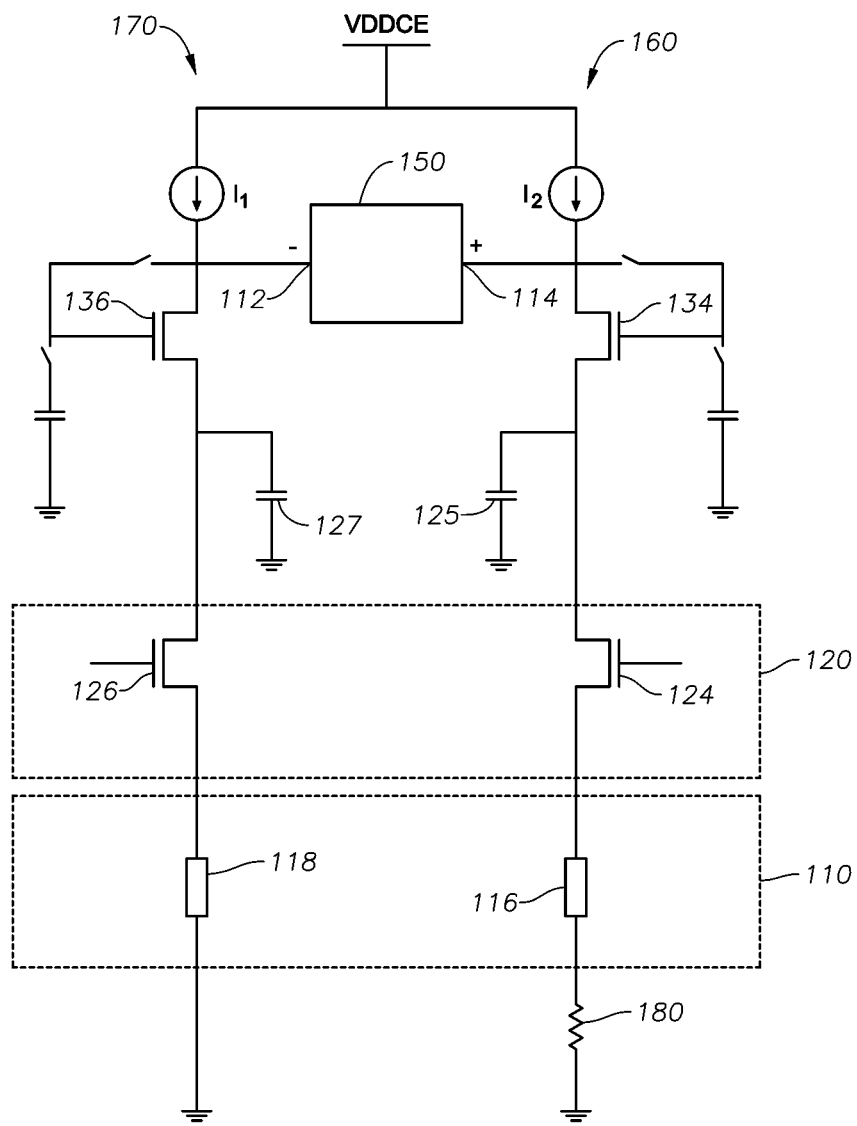
FIG. 1 is a schematic diagram of a circuit in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a circuit is disclosed. In a particular implementation, the circuit comprises: a memory array including a plurality of bit cells, where each of the bit cells are coupled to a respective bit path; a first multiplexer comprising a plurality of column address locations, where each of the plurality of column address locations is coupled to the memory array and corresponds to a respective bit path capacitance; and a variable capacitance circuit coupled to a reference path and configured to substantially match reference path capacitance to each of the respective bit path capacitances.

According to another implementation of the present disclosure, a method for source line capacitor modulation and to compensate capacitor mismatch during a read operation of a non-volatile memory bit cell is disclosed. For example, the method includes detecting, at a node on a reference path, a column address location coupled on a bit path corresponding to a bit cell; and controlling a reference path capacitance to substantially match to a bit path capacitance corresponding to the column address location.

According to another implementation of the present disclosure, a system is disclosed. The system includes: a variable capacitance circuit coupled to a reference path of an amplifier circuit and a first multiplexer and configured to track a column address location of the first multiplexer. In certain implementations, the variable capacitance circuit may be further configured to balance a reference path capacitance to a bit path capacitance corresponding to the column address location.

Particular implementations of the present disclosure are described below with reference to the drawings. In the description, common features are designated by common reference numbers throughout the drawings.

Advantageously, to allow for proper read operations, aspects of the present disclosure provide solutions to substantially minimize signal variation across different columns of a bit path multiplexer coupled to a memory array. In doing so, the inventive aspects substantially reduces capacitor mismatch (i.e., capacitance mismatch) by providing capacitor balancing between reference and bit paths input to an amplifier circuit.

Referring to FIG. 1, a schematic representation of an integrated circuit 100 (i.e., input circuit, system) (e.g., current or voltage sense amplifier input arrangements) according to example implementations is shown. As illustrated, the integrated circuit 100 illustrates an example reference path 160 and an example bit path 170 for an example amplifier circuit 150. In various implementations, the reference path 160 (i.e., a reference circuit) (including a reference impedance) and a bit path 170 (i.e., a bit circuit) (including a bit impedance) may be coupled via first and second input terminals (e.g., negative and positive input terminals, or alternatively, positive and negative input terminals) 112, 114, respectively, of the sense amplifier 150. As discussed herein, for each of the circuit configurations, the first and second input terminals 112, 114 may be interchangeable as positive or negative input terminals.

In certain implementations, the reference path 160 includes a first MTJ device 116 (e.g., an MRAM reference cell, a low resistive state (LRS) MTJ, a reference cell), a reference multiplexer switch 124, a first access device 134 (e.g., a NMOS device), and a capacitor 125 (i.e., a fixed capacitor). Correspondingly, the bit path 170 includes a second MTJ device 118 (e.g., an MRAM bit cell), a high resistive state (HRS) MTJ or an LRS MTJ), a column multiplexer switch 126 (e.g., one of a plurality of column multiplexer switches), a second access device 136, and a capacitor 127. Also, the circuit 100, includes a resistor 180 (i.e., a sense amplifier (SA) trim, a CMOS resistor shifter, a CMOS resistor element, a resistive offset) coupled to the reference path 160. In another implementation (not shown), such a resistor 180 may be couple to the bit path 170 to provide for resistance matching.

In an example read operation, a constant current may be transmitted through both reference and bit paths of the integrated circuit 100. Once such constant current is transmitted, a voltage drop can be seen on each of the reference path 160 and bit path 170 that would be proportional to respective resistances for each path 160, 170. Upon allowing voltages on respective nodes on the reference and bit paths 160, 170 to "rise up" to a predetermined voltage level, a sensing action can be triggered. As the voltage level may take some time to settle, depending on the capacitances on the respective paths (i.e., lines), it would be critical to match the capacitances of both paths. Accordingly, an amplifier circuit 150 can sense the differences in voltages on the paths 160, 170 that is proportionate to the respective capacitances. In various implementations, the amplifier circuit 150 would output a logic "1" or a logic "0" depending on the sensed resistances. The "1" or "0" would represent whether an example bit cell is higher or lower with respect to an example reference cell.

Accordingly, in such an operation, a signal may be developed as a difference in voltage levels between the bit cell 118 and reference cell 116. If capacitances $C_{bit}$ 127 (e.g., with reference to certain examples in FIG. 2, Cx (if column 20 is selected) or Cy (if column 0 is selected) and $C_{ref}$ 125 match, the difference may be determined by the difference in resistance of the bit cell 118 and the reference cell 116. However, if there is any mismatch in capacitance, the charging levels of the capacitors 125, 127 would be different for the bit cell 118 and the reference cell 116. Consequently, this difference in charging levels can influence the actual read signal and would increase or decrease the read signal depending on read0 and read1. In certain examples, read0 may be when a bit cell resistance is less than that of a reference cell resistance, and read1 may be when a bit cell resistance is greater than that of reference cell resistance. Hence, when a capacitance on a bit path is less than that of a reference path, a node (e.g., shared bit line read (SH_BLR)) on the bit path would "rise faster" as compared to that of a reference path (e.g., shared source line read (SH_SLR)). Consequently, the location with the "worst" read0 having the "least" capacitance on the bit path in comparison to the reference path would be best for read1 and vice-versa. In prior known read schemes, an example read signal may vary by approximately 21 mV for read0/read1 at different column placement locations because of the difference in capacitor and resistance with regard to the reference bit. As observed, while the absolute signal may be around 60 mv, the variation is seen as more than 33%.

In one example, for multiplexer placement in conventional MRAM circuitry, excess routing on one of the reference path or bit path would be seen with regard to certain column address locations (i.e., column placements). For instance, there would be additional extra routing on the reference path (in comparison to that of the bit path) for column placements nearest to the memory array that would cause capacitor mismatch. In another instance, there would be additional extra routing on the bit path (in comparison to that of the reference path) for column placements furthest to the memory array that would cause capacitor mismatch.

Advantageously, to compensate for such capacitor mismatch, the inventive aspects provide for adding or removing additional capacitance onto the reference path to modulate to the bit path capacitance. Hence, the inventive aspects provide systems, integrated circuits, and methods to create a "variable capacitor" that can track column address locations (i.e., address locations) (e.g., $120_1$-$120_{31}$ as described with reference to FIG. 2 below) and adjust accordingly.

Figure 2:
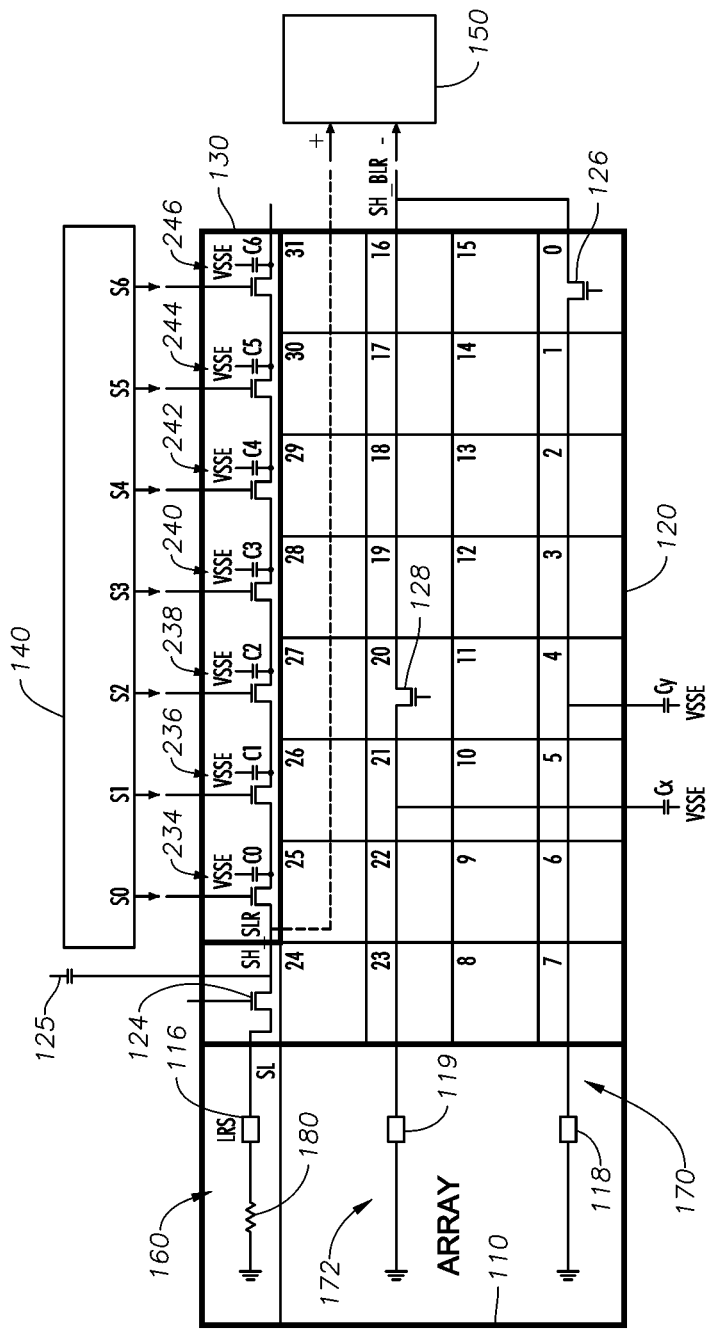
FIG. 2 is a schematic diagram of a circuit in accordance with various implementations described herein.

Referring to FIG. 2, an example schematic block and embedded circuit diagram corresponding to the integrated circuit 100 in FIG. 1 is shown. As illustrated, the integrated circuit includes a memory array 110 (i.e., a non-volatile memory array (e.g., an MRAM array)), a first multiplexer 120 (i.e., a data selector, a first multiplexer block), a variable capacitor circuit 130 (i.e., a variable capacitor arrangement), a column decoder 140, and a sense amplifier 150 (e.g., a differential amplifier). In certain implementations, the memory array 110 may include a plurality of bit cells (e.g., bit cells 118, 119), where each of the bit cells are coupled to a respective bit path (i.e., a respective bit column) (e.g., bit paths 170, 172) and a reference path (i.e., a reference bit column) (e.g., reference path 160). Also, the first multiplexer 120 may include a plurality of address locations (e.g., $120_1$-$120_{31}$) (i.e., column address locations, multiplexer placements) (e.g., column multiplexer switches 126, 128), where each of the plurality of address locations is coupled to the memory array 110 and corresponds to a respective bit path capacitance. Moreover, the variable capacitor circuit 130 (i.e., variable capacitance circuit) may be coupled to the reference path 160 and may include a second multiplexer 124 (e.g., a single reference multiplexer switch) and one or more address dependent variable capacitors (ADVC) (e.g., ADVC 234, 236, 238, 240, 242, 244, and 246) that are coupled to one another in a sequential series. Also, each of the ADVC may correspond to a different reference path capacitance (i.e., charging level) and can be configured to approximately equate (i.e., substantially match, balance, modulate) or equate (i.e., match) to the respective bit path capacitance. Hence, the integrated circuit is configured to adjust the reference path capacitance (at node SH_SLR) to approximately align to the bit path capacitance (at node SH_BLR).

In certain implementations, the second multiplexer 124 is configured as a single reference multiplexer switch 124, where the switch 124 is coupled to the one or more ADVC (i.e., switch capacitor combinations) (e.g., ADVC 234, 236, 238, 240, 242, 244, and 246). In certain implementations, each of the ADVC comprise a respective NMOS transistor (e.g., S0-S6) coupled to a respective capacitor (e.g., C0-C6). As each capacitor would represent a different capacitor value, capacitance can vary with the addition or removal of a capacitor in the sequential series.

As depicted, each of the ADVC (e.g., ADVC 234, 236, 238, 240, 242, 244, and 246) include a switch and capacitor combination. For example, ADVC 234 may include: a first switch S0 and a first capacitor C0; ADVC 236 may include a second switch S1 and a second capacitor C1; ADVC 238 may include a third switch S2 and third capacitor C2; ADVC 240 may include a fourth switch S3 and fourth capacitor C3; ADVC 242 may include a fifth switch S4 and fifth capacitor C4; ADVC 244 may include a sixth switch S5 and sixth capacitor C5; and ADVC 246 may include a seventh switch S6 and seventh capacitor C6.

As illustrated in FIG. 2, in certain implementations, the column decoder 140 may be coupled to each of the ADVC (e.g., ADVC 234, 236, 238, 240, 242, 244, and 246) and configured to select one of the plurality of column address locations 120 (e.g., $120_1$-$120_{31}$). Based on a selection of a particular column address location, the variable capacitance circuit 130 can be configured to "track" (i.e., follow) the selected column address location and modulate (i.e., balance) capacitance on the reference path 160 that is coupled to variable capacitance circuit 130. In certain implementations, each of the column address locations (e.g., $120_1$-$120_{31}$) may include a respective pass-transistor gate (i.e., (i.e., an NMOS transistor) configured as a switch of the first multiplexer 120.

With reference to FIGS. 1 and 2, the integrated circuit 100 further includes an amplifier circuit 150 (e.g., a differential circuit/sense amplifier circuit) to control the reference path capacitance. The amplifier circuit 150 may be coupled to the first multiplexer 120 and the variable capacitor circuit 130. As example implementations, voltage and current signals from example bit paths 170, 172 may be transmitted through the first multiplexer 120 to the amplifier circuit 150, while the example reference path 160 may be transmitted through the variable capacitor circuit 130 to the amplifier circuit 150.

In example operations, with reference to one example in FIG. 2, the amplifier circuit 150 of the integrated circuit is configured to detect, (i.e., sense), at a node (shared bit line read (SH_BLR)) on the reference path 160, the column address location corresponding to the bit cell to be read (i.e., the selected column address location); and based on the detection, the variable capacitor circuit 130 is configured to control (i.e., modulate) the reference path capacitance (i.e., charging level) to substantially match the bit path capacitance corresponding to the column address location (corresponding to the bit cell to be read).

Furthermore, the amplifier circuit 150 can be configured to: determine (i.e., sense) a reference capacitance value (i.e., a specific charging level) corresponding to bit capacitance value; and based on the determination, the variable capacitor circuit 130 is configured to alter (i.e., change) (e.g., increase/decrease) the reference capacitor value to substantially equate to the column address location (corresponding to the bit cell to be read).

Figure 3:
FIG. 3 is a table in accordance with various implementations described herein.

As one example as shown in FIG. 2, the bit cell (to be read) 118 may correspond to the column address location 0 (i.e., $120_0$) In such an operation, first, the amplifier circuit 150 may detect at a node on the bit path 170 that column address location 0 corresponds to bit cell 118. Second, based on the detection, the variable capacitor circuit 130 may control (i.e., modulate) the reference path capacitance (i.e., charging level) to substantially match the bit path capacitance corresponding to the column address location 0. Third, the amplifier circuit 150 can also be configured to determine (i.e., sense) a reference capacitance value (i.e., a specific charging level) corresponding to a bit capacitance value of column address location 0. For instance, for column address location 0, the reference capacitance value corresponds to the fixed reference (ref)+capacitors C0 through C6 (as illustrated in the table of FIG. 3). Fourth, the variable capacitor circuit 130 may then alter (i.e., change) (e.g., increase/decrease) the reference capacitor value to fixed reference (ref)+capacitors C0 through C6 to substantially equate to the column address location 0.

As one example as shown in FIG. 2, the bit cell (to be read) 119 may correspond to the column address location 20 (i.e., $120_{20}$). In such an operation, first, the amplifier circuit 150 may detect at a node on the reference path 160 that column address location 20 corresponds to bit cell 119. Second, based on the detection, the variable capacitor circuit 130 may control (i.e., modulate) the reference path capacitance (i.e., charging level) to substantially match the bit path capacitance corresponding to the column address location 20. Third, the amplifier circuit 150 can also be configured to determine (i.e., sense) a reference capacitance value (i.e., a specific charging level) corresponding to the bit capacitance value of column address location 20. For instance, for column address location 20, the reference capacitance value corresponds to the fixed reference (ref)+capacitors C0 through C2 (as illustrated in the table of FIG. 3). Fourth, the variable capacitor circuit 130 may then alter (i.e., change) (e.g., increase/decrease) the reference capacitor value to fixed reference (ref)+capacitors C0 through C2 to substantially equate to the column address location 20. In other examples (not shown), similar operations may be performed for other bit cells (to be read) respectively corresponding to other column address locations.

In certain implementations, with reference to FIG. 2, respective additional metal capacitors (e.g., Cx and Cy) (i.e., practical metal capacitors) may be included on each of the reference paths 170, 172. For instance, Cx may be included on the example bit path 172, while Cy may be included on the example bit path 170. With reference to the example as illustrated, the capacitance of Cy is greater than that of Cx due to a longer routing from the memory array 110 to the first multiplexer 120.

Referring to FIG. 3, a table 300 corresponding to the circuit diagram corresponding to the integrated circuit 100 in FIGS. 1 and 2 is shown. According to inventive aspects, by switching off one or more of the switches S0-S7 (e.g., NMOS switches) based on the column address, alignment may be realized between bit path capacitance and reference path capacitance.

In operation, in certain examples, as shown in FIG. 3, if any of the column addresses (i.e., column address locations) 24 (i.e., $120_{24}$)/23 (i.e., $120_{23}$)/8 (i.e., $120_8$)/7 (i.e., $120_7$) are selected, the first switch (i.e., S0) would be decoupled (e.g., S0 set to "0"), and thus, in this instance, all of the other capacitors (C0 to C6) would be removed (i.e., turned off) (e.g., S1-S7 set to "1"). Hence, the capacitance on the reference path would equal reference (ref)+0, and would be approximately equal to the bit path capacitance of the selected column address location.

In certain second examples, as shown in FIG. 3, if any of the column addresses (i.e., column address locations) 25 (i.e., $120_{25}$)/22 (i.e., $120_{22}$)/9 (i.e., $120_9$)/6 (i.e., $120_6$) are selected, the second switch (i.e., S1) would be decoupled (e.g., S1 set to "0"), and thus, each of the switches S2-S7 are turned off, while S0 is turned on. Thus, in this instance, the capacitance on the reference may be substantially equal to the fixed reference (ref)+capacitor C0, and would be approximately equal to the bit path capacitance of the selected column address location.

In certain third examples, as shown in FIG. 3, if any of the column addresses (i.e., column address locations) 26 (i.e., $120_{26}$)/21 (i.e., $120_{21}$)/10 (i.e., $120_{10}$)/5 (i.e., $120_5$) are selected, the third switch (i.e., S2) would be decoupled (e.g., S2 set to "0"), and thus, each of the switches S3-S7 are turned off, while S0 and S1 are turned on. Thus, in this instance, the capacitance on the reference may be substantially equal to the fixed reference (ref)+capacitors C0 and C1, and would be approximately equal to the bit path capacitance of the selected column address location.

In certain fourth examples, as shown in FIG. 3, if any of the column addresses (i.e., column address locations) 27 (i.e., $120_{27}$)/20 (i.e., $120_{20}$)/11 (i.e., $120_{11}$)/4 (i.e., $120_4$) are selected, the fourth switch (i.e., S3) would be decoupled (e.g., S3 set to "0"), and thus, each of the switches S4-S7 are turned off, while S0 to S2 are turned on. Thus, in this instance, the capacitance on the reference may be substantially equal to the fixed reference (ref)+capacitors C0 to C2, and would be approximately equal to the bit path capacitance of the selected column address location.

In certain fifth examples, as shown in FIG. 3, if any of the column addresses (i.e., column address locations) 28 (i.e., $120_{28}$)/19 (i.e., $120_{19}$)/12 (i.e., $120_{12}$)/3 (i.e., $120_3$) are selected, the fifth switch (i.e., S4) would be decoupled (e.g., S4 set to "0"), and thus, each of the switches S5-S7 are turned off, while S0 to S3 are turned on. Thus, in this instance, the capacitance on the reference may be substantially equal to the fixed reference (ref)+capacitors C0 to C3, and would be approximately equal to the bit path capacitance of the selected column address location.

In certain sixth examples, as shown in FIG. 3, if any of the column addresses (i.e., column address locations) 29 (i.e., $120_{29}$)/18 (i.e., $120_{18}$)/13 (i.e., $120_{13}$)/2 (i.e., $120_2$) are selected, the sixth switch (i.e., S5) would be decoupled (e.g., S5 set to "0"), and thus, each of the switches S6 and S7 are turned off, while S0 to S4 are turned on. Thus, in this instance, the capacitance on the reference may be substantially equal to the fixed reference (ref)+capacitors C0 to C4, and would be approximately equal to the bit path capacitance of the selected column address location.

In certain seventh examples, as shown in FIG. 3, if any of the column addresses (i.e., column address locations) 30 (i.e., $120_{30}$)/17 (i.e., $120_{17}$)/14 (i.e., $120_{14}$)/1 (i.e., $120_1$) are selected, the seventh switch (i.e., S6) would be decoupled (e.g., S6 set to "0"), and thus, just the switch S7 would be turned off, while S0 to S5 are turned on. Thus, in this instance, the capacitance on the reference may be substantially equal to the fixed reference (ref)+capacitors C0 to C5, and would be approximately equal to the bit path capacitance of the selected column address location.

In certain eighth examples, as shown in FIG. 3, if any of the column addresses (i.e., column address locations) 31 (i.e., $120_{31}$)/16 (i.e., $120_{16}$)/15 (i.e., $120_{15}$)/0 (i.e., $120_0$) are selected, the seventh switch (i.e., S6) would be decoupled (e.g., S6 set to "0"), and thus, just the switch S7 would be turned off, while S0 to S5 are turned on. Thus, in this instance, the capacitance on the reference may be substantially equal to the fixed reference (ref)+capacitors C0 to C6, and would be approximately equal to the bit path capacitance of the selected column address location.

Figure 4:
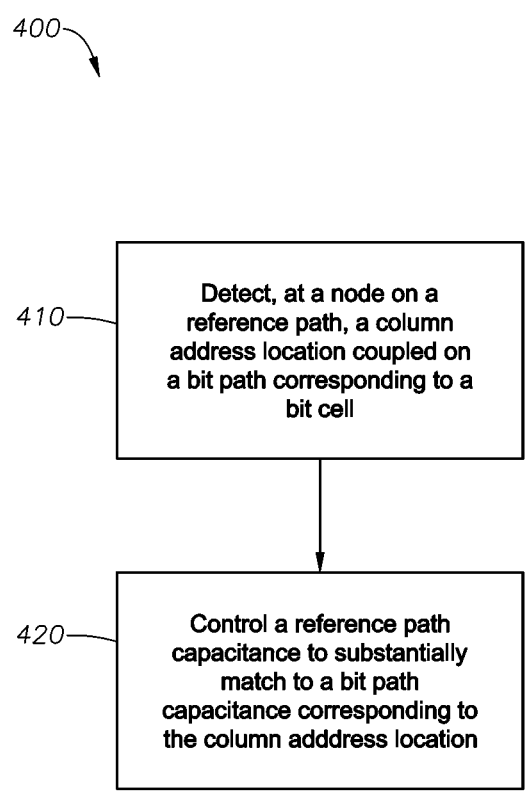
FIG. 4 is a flowchart of a particular illustrative aspect of methods in accordance with various implementations described herein.

Referring to FIG. 4, a flowchart of a method 400 applicable for the above-mentioned integrated circuit 100 with reference to FIGS. 1-3 is shown. In certain examples, the method 400 is applicable for source line capacitor modulation. Advantageously, the method 400 can compensate for capacitor mismatch during a read operation of a NVM bit cell (e.g., MRAM bit-cell)). Advantageously, utilizing inventive scheme and methods can prevent capacitor mismatch between bit and reference paths by aiding in the removal of signal variation across the different columns.

At block 410, at a node on the reference path, a column address location coupled to the bit path corresponding to a bit cell to be read may be detected/sensed. For instance, with reference to FIGS. 1-3, at a node (e.g., SH_SLR) on the reference path 160 (i.e., a reference column), a column address location (e.g., one column address locations (e.g., $120_1$-$120_{31}$)) coupled to the bit path (i.e., a bit column) 170 corresponding to a bit cell 118 to be read is detected/sensed.

At block 420, a reference path capacitance to substantially match a bit path capacitance corresponding to the column address location is controlled (i.e., modulated). For instance, with reference to FIGS. 1-3, a reference path 170 capacitance to substantially match a bit path 160 capacitance corresponding to the column address location (e.g., the selected one of column address locations (e.g., $120_1$-$120_{31}$) is controlled (i.e., modulated).

In additional implementations, a current on a reference path and a bit path of an integrated circuit is provided. For instance, as shown in FIGS. 1-3, one or more currents may be provided on the reference path 160 and the bit path 170 of the integrated circuit 100. For instance, with reference to FIGS. 1-3, a constant current may be transmitted through both reference and bit paths of the integrated circuit 100.

In additional implementations, the method 400 further includes: determining a reference capacitance value (i.e., charging levels) corresponding to bit capacitance value; and altering (i.e., changing) (e.g., increasing/decreasing) the reference capacitor value to substantially equate to the column address location. For instance, with reference to FIGS. 1-3, a reference capacitance value (i.e., charging levels) corresponding to bit capacitance value may be determined by the amplifier circuit 150. For instance, with reference to FIGS. 1-3, the reference capacitance value (i.e., charging levels) (e.g., reference+the cap on the reference as described in the various examples with regard to FIG. 3) may be altered to substantially equal to the column address location (e.g., the selected one of column address locations (e.g., $120_1$-$120_{31}$) by the variable capacitor circuit 130.

In certain examples, increasing the reference capacitance includes activating one or more switches (e.g., one or more of switches S0 to S6 in sequential order), on the reference path 160, where each of the one or more switches is coupled to a respective capacitor (e.g., C0 to C6). Also, in certain other examples, decreasing the reference capacitance includes de-activating one or more switches (e.g., one or more of switches S0 to S6 in sequential order), on the reference path 160, where each of the one or more switches (e.g., one or more of switches S0 to S6 in sequential order) is coupled to a respective capacitor (e.g., C0 to C6).

Advantageously, while the disclosure has been described in the context of MRAM bit-cells, such implementations, methods, and techniques as described herein may be performed in any other type of memory cells where capacitor mismatch prevents accurate memory read operations.

In example implementations, certain circuit elements have been provided in FIGS. 1-3, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-10 may illustrate systems, apparatuses, or methods according to the teachings of the disclosure, the disclosure is not limited to these illustrated systems, apparatuses, or methods. One or more functions or components of any of FIGS. 1-3 as illustrated or described herein may be combined with one or more other portions of another of FIGS. 1-3. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An integrated circuit comprising:
a memory array comprising a plurality of bit cells coupled to respective bit paths, wherein the memory array comprises a magnetic random access memory (MRAM) array, and wherein each of the bit cells comprise magnetic tunnel junction (MTJ) bit cells;
a first multiplexer comprising a plurality of column address locations, wherein each of the plurality of column address locations is coupled to a corresponding bit cell in the memory array, and wherein each of the plurality of column address locations corresponds to a respective bit path capacitance for each of the respective bit paths;
an amplifier circuit coupled to the first multiplexer, wherein the amplifier circuit is configured to sense the column address location corresponding to the bit cell to be read by way of a reference path; and
a variable capacitance circuit coupled to the amplifier circuit by way of a reference path, wherein the variable capacitance circuit is configured to substantially match a reference path capacitance to each of the respective bit path capacitances by adjusting the reference path capacitance to substantially match bit path capacitance corresponding to the column address location of the bit cell to be read.

2. The integrated circuit of claim 1, wherein the integrated circuit is configured to adjust the reference path capacitance to align to each of bit path capacitances of the plurality of column address locations.

3. The integrated circuit of claim 1, wherein each of the column address locations comprises a respective pass-transistor gate configured as a switch of the first multiplexer.

4. The integrated circuit of claim 1, wherein the variable capacitance circuit comprises a second multiplexer and one or more address dependent variable capacitors, and wherein each of the one or more address dependent variable capacitors is configured to approximately equate to the respective bit path capacitance.

5. The integrated circuit of claim 4, wherein the second multiplexer comprises a switch, and wherein the switch is coupled to the one or more address dependent variable capacitors.

6. The integrated circuit of claim 4, wherein each of the one or more address dependent variable capacitors comprises a respective NMOS transistor coupled to a reference capacitor.

7. The integrated circuit of claim 4, wherein the one or more address dependent variable capacitors comprise at least first and second the one or more address dependent variable capacitors coupled in series.

8. The integrated circuit of claim 1, further comprising:
   a column decoder coupled to each of the one or more address dependent variable capacitors and configured to select one of the plurality of column address locations.

9. The integrated circuit of claim 8, wherein based on the selection of the column address location, the variable capacitance circuit is configured to adjust the reference path capacitance on the reference path.

10. The integrated circuit of claim 1, wherein the amplifier circuit is further configured to:
    determine a reference capacitance value corresponding to a bit capacitance value.

11. The integrated circuit of claim 1, wherein the variable capacitance circuit is configured to:
    alter the reference capacitor value to substantially equate to the column address location.

* * * * *